United States Patent
Schmidt (10) Patent No.: US 12,406,891 B2
(45) Date of Patent: Sep. 2, 2025

(54) CHARACTERIZATION OF ASYMMETRIC MATERIAL DEPOSITION FOR METROLOGY

(71) Applicant: INTERNATIONAL BUSINESS MACHINES CORPORATION, Armonk, NY (US)

(72) Inventor: Daniel Schmidt, Niskayuna, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 1008 days.

(21) Appl. No.: 17/490,564

(22) Filed: Sep. 30, 2021

(65) Prior Publication Data

US 2023/0114601 A1  Apr. 13, 2023

(51) Int. Cl.
*H01L 21/66* (2006.01)
*H01L 23/544* (2006.01)

(52) U.S. Cl.
CPC ............ *H01L 22/20* (2013.01); *H01L 23/544* (2013.01); *H01L 2223/54426* (2013.01)

(58) Field of Classification Search
CPC .............................. H01L 22/20; H01L 23/544
See application file for complete search history.

(56) References Cited

U.S. PATENT DOCUMENTS

| | | | |
|---|---|---|---|
| 6,573,999 B1 * | 6/2003 | Yang .................. | G01B 11/0625 356/630 |
| 9,576,861 B2 | 2/2017 | Park et al. | |
| 9,633,915 B1 * | 4/2017 | Park ........................ | H01J 37/28 |
| 9,646,896 B2 | 5/2017 | Hsieh et al. | |
| 9,786,569 B1 * | 10/2017 | Ho ........................... | H01L 22/20 |
| 10,228,320 B1 | 3/2019 | Levinski et al. | |
| 10,481,504 B2 | 11/2019 | Ausschnitt et al. | |
| 10,534,276 B1 | 1/2020 | Yang et al. | |

(Continued)

FOREIGN PATENT DOCUMENTS

| | | |
|---|---|---|
| EP | 3712817 A1 | 9/2020 |
| WO | 2019199340 A1 | 10/2019 |

OTHER PUBLICATIONS

Ausschnitt et al., "Pattern shift response metrology", SPIE 10810, Photomask Technology 2018, Oct. 8, 2018, pp. 1-12.

(Continued)

*Primary Examiner* — Cachet I Proctor
(74) *Attorney, Agent, or Firm* — Tutunjian & Bitetto, P.C.; Samuel Waldbaum (57) ABSTRACT

A method of characterizing asymmetric depositions on a target is provided. The method includes forming at least four asymmetrical petals in a layer on a substrate, and depositing a light-absorbing material on the at least four asymmetrical petals, wherein the light-absorbing material deposits unevenly on a plurality of walls of the at least four asymmetrical petals. The method further includes determining a pattern shift response (PSR) from the light-absorbing material on each of the walls of the at least four asymmetrical petals, and converting the pattern shift response (PSR) to an asymmetry of thicknesses of the light-absorbing material deposited on facing walls of the at least four asymmetrical petals. The method further includes correcting an overlay petal position based on the asymmetry of thicknesses.

14 Claims, 9 Drawing Sheets

(56) References Cited

U.S. PATENT DOCUMENTS

| | | |
|---|---|---|
| 10,761,432 B2 | 9/2020 | Mathijssen et al. |
| 10,831,108 B2 | 11/2020 | Marciano et al. |
| 2005/0018289 A1* | 1/2005 | Yanowitz ............ G03F 7/70258 359/462 |
| 2006/0023214 A1* | 2/2006 | Lof ....................... G03F 9/7084 356/401 |
| 2007/0194466 A1* | 8/2007 | Yamaguchi ........... G03F 9/7076 257/E23.179 |
| 2009/0009741 A1* | 1/2009 | Okita ................... G03F 7/7085 702/82 |
| 2018/0284624 A1* | 10/2018 | Ausschnitt ............. G01B 11/24 |
| 2019/0137881 A1* | 5/2019 | Ausschnitt .......... G03F 7/70633 |
| 2020/0233317 A1* | 7/2020 | Ausschnitt ............. G01B 11/24 |
| 2020/0241428 A1* | 7/2020 | Marciano ............ G03F 7/70491 |

OTHER PUBLICATIONS

Sullivan et al., "Overlay metrology: the systematic, the random and the ugly", InAIP Conference Proceedings (vol. 449, No. 1, pp. 502-512). American Institute of Physics, Nov. 24, 1998, pp. 1-12.

* cited by examiner

CHARACTERIZATION OF ASYMMETRIC MATERIAL DEPOSITION FOR METROLOGY

BACKGROUND

The present invention generally relates to characterization of asymmetric material deposition for metrology, and more particularly to characterization of asymmetric absorbing material deposition for overlay metrology correction.

In the manufacturing of devices on a semiconductor wafer, the device features are formed layer by layer, where the features of one layer must be properly aligned to features in another layer. The layers have to be lined up on top of each other for the fabricated features to be functional. Alignment structures in non-die areas of a wafer can be used to align photomasks to the die areas on the wafer. Overlay metrology involves a process of taking alignment measurements between two or more different layers. Changes in the positions of targets are measured by overlay measurements, i.e. the measurement of the change in position of one target relative to another. Overlay measurements can be performed via test patterns that are printed together with layers on the wafer. Overlay metrology systems detect unwanted shifts in position between the layers, as well as process variations. Edge placement error (EPE) is the difference between the intended and the printed features of an circuit layout. Pattern placement error (PPE) describes the shift of entire features.

Printing a pattern in a resist layer on a layer stack involves exposing a lithographic (photo) mask to a light source and developing the exposed and unexposed areas of the resist. Etching using the patterned resist transfers the lithographic mask pattern to the layer stack. Overlay is the ability of a lithography system to print accurate features on each layer exactly where they are intended. Alignment marks or targets are placed on both a wafer and the photomask. Then, in a lithography system, a wafer stage and reticle stage aligns the marks/targets with one another. Targets mimic the behavior of the device being fabricated.

A main dimension of a feature of interest is referred to as the critical dimension (CD). Transistor performance relies on critical dimensions. An accurate and repeatable way of verifying the critical dimensions of printed and/or etched pattern features can be useful for fabrication processes for semiconductor devices. Critical dimensions in patterns produced on a substrate in a process step can be monitored by adding one or more metrology targets to a pattern design. MRAM pillar overlay is done based on topography because magnetic tunnel junction (MTJ) stack(s) and metal HM layers are not transparent at wavelengths relevant for overlay (OVL) metrology.

SUMMARY

In accordance with an embodiment of the present invention, a method of characterizing asymmetric depositions on a target is provided. The method includes forming at least four asymmetrical petals in a layer on a substrate, and depositing a light-absorbing material on the at least four asymmetrical petals, wherein the light-absorbing material deposits unevenly on a plurality of walls of the at least four asymmetrical petals. The method further includes determining a pattern shift response (PSR) from the light-absorbing material on each of the walls of the at least four asymmetrical petals, and converting the pattern shift response (PSR) to an asymmetry of thicknesses of the light-absorbing material deposited on facing walls of the at least four asymmetrical petals. The method further includes correcting an overlay petal position based on the asymmetry of thicknesses.

In accordance with another embodiment of the present invention, a method of characterizing asymmetric depositions on a target is provided. The method includes forming a first overlay petal and a first pattern shift response (PSR) petal in a first layer on a substrate, and depositing a light-absorbing material on the first overlay petal and the first pattern shift response (PSR) petal, wherein the light-absorbing material deposits unevenly on a plurality of walls of the first overlay petal and the first pattern shift response (PSR) petal. The method further includes measuring an intensity profile for the first PSR petals, and calculating a light-absorbing material deposition asymmetry based on a PSR shift. The method further includes forming a second overlay petal in a second layer, and measuring an overlay difference between the first overlay petal and the second overlay petal. The method further includes correcting an overlay petal position based on the light-absorbing material deposition asymmetry.

In accordance with yet another embodiment of the present invention, a method of characterizing asymmetric depositions on a target is provided. The method includes forming at least four asymmetrical petals in a layer on a substrate, wherein the at least four asymmetrical petals include two pairs of two asymmetrical petals, wherein the two asymmetrical petals of each pair form a mirror image, and wherein a third pair of asymmetrical petals has a different duty cycle than the first two pairs. The method further includes depositing a light-absorbing material on the at least four asymmetrical petals, wherein the light-absorbing material deposits unevenly on a plurality of walls of the at least four asymmetrical petals, and determining a pattern shift response (PSR) from the light-absorbing material on each of the walls of the at least four asymmetrical petals. The method further includes converting the pattern shift response (PSR) to an asymmetry of thicknesses of the light-absorbing material deposited on facing walls of the at least four asymmetrical petals, and correcting an overlay petal position based on the asymmetry of thicknesses.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention provide asymmetric metrology petals (also referred to as marks), where each petal can include a uniform or symmetrical portion and a periodic or asymmetrical portion. Asymmetric deposition characterization can be used for overlay metrology corrections, when a light-absorbing material layer is deposited between a first (prior) and a second (current) overlay (OVL) mark. A location representative of a center-of-gravity position for an asymmetric printed or etched mark (petal) may be determined based on an intensity profile of an image of the asymmetric mark, where the position of the center-of-gravity can be shifted in the direction of asymmetry. The center-of-gravity (or centroid-representative) position may be obtained by integrating the intensity profile obtained from the mark with respect to a reference intensity value, and determining the centroid of the area between the reference intensity and the profile. The edges of an intensity profile across the mark in the direction of asymmetry may be determined, and a center-of-gravity identified as the 50% change between the lightest and darkest intensity values.

In various embodiments, the pattern shift response (PSR) target(s) can include asymmetrical PSR petals (marks) used for overlay metrology corrections and overlay petals (marks), where the overlay petals (marks) can be symmetrical. A plurality of PSR petals and overlay petals can form an array of petals that make up the pattern shift response (PSR) target. Each PSR target can have four (4) quadrants, where a PSR petal, a prior overlay petal, and a current overlay petal can be in each quadrant. The asymmetrical PSR petals can be rotated between the quadrants, but where the PSR petal(s) in the quadrants across a diagonal have the same orientation, and PSR petal(s) in adjacent quadrants have different orientations. In various embodiments, a 4×9 or 4×16 petal array can form a target, for example, a triple AIM target.

Embodiments of the present invention provide a method of overlay measurement/metrology corrections utilizing pattern shift response (PSR) petals with overlay petals, where PSR petals can be formed in a first layer including the overlay petals. In various embodiments, a light-absorbing material can be deposited on the PSR petals and the position of the center-of-gravity of the PSR petals measured. The light-absorbing material deposition on the PSR petals may not be equal or uniform, and thereby introduce a perceived shift in the overlay petal position. The light-absorbing material deposition asymmetry based on PSR shift can be calculated by relating the intensity profile to a material thickness. The relationship between the intensity profile and the light-absorbing material thickness(es) can be determined using a destructive cross-sectional microscopy technique, where the PSR shift can be associated with observer material thickness(es). A center-of-gravity of the light-absorbing material deposited petals can have an unequal shift due to unequal deposition of the light-absorbing material on the different walls of the petals.

The center-of-gravity (or centroid) is the midpoint of integrated density that is sensitive to its interior shape dimensions. For example, a periodic array of lines of fixed width, w, and pitch, p, has an interior density of w/p, known as "duty cycle." A duty cycle is proportional to the dimensions of periodic petal features. The overlay petal position for a first layer can be corrected based on these measured deposition characteristics. In various embodiments, light-absorbing material deposition asymmetry characterization can be done across a wafer with multiple PSR targets, where each PSR target includes a plurality of PSR petals that can provided a measured shift for both an X-axis and a Y-axis. There can be a greater deposition asymmetry as the location of target(s) shifts towards the edges of the surface/wafer. This can be partially due to shadowing effects of the petal trench opening and walls or due to the particle flux or other dynamics in the process chamber. In various embodiments, from the measured position of the centroids of the PSR petals and PSR targets, a position related parameter, S, can be derived.

Asymmetric light absorbing material deposition can result in a perceived shift of the overlay target of the prior layer, which introduces overlay errors that cannot be mitigated without characterizing the location-dependent deposition anisotropy. If trench sidewalls of the petals are deposited asymmetrically with the light-absorbing materials, which can be, for example, semiconductor material, metals, metal compounds, etc., the coated petal pattern appears to be shifted when measured by an optical tool (e.g. OVL microscope) because the actual position of the uncoated petals cannot be resolved. The original position of a trench for each petal cannot be identified by the overlay tool because there is no contrast between the trench and the rest of the surface. In the case of overlay (OVL) petals (marks), this phenomenon will lead to an OVL error proportional to half the asymmetry of the deposition coating because the center-of-gravity of the coated feature appears shifted with respect to the original petal location. This can lead to false OVL metrology and hence errors in the amount and direction of an overlay correction, that is, a current layer can be shifted by an amount related to the extent of the asymmetric deposition. In various embodiments, the perceived target shift can be quantified and fed forward to correct overlay measurement(s).

In various embodiments, the surface including the one or more petal trenches can be coated in a light-absorbing material, for example, by a physical vapor deposition (PVD) process, and excess light-absorbing material removed to leave asymmetrically deposited light-absorbing material in the petal trenches, for example, by chemical-mechanical polishing (CMP). An overlay (OVL) tool "sees" the metal-coated target as the intensity profile from a top-down view, where the target, including the PSR petals, appears shifted in location due to the asymmetric light-absorbing material deposition resulting from angular deposition characteristic moving away from the center of the surface. The tool sees an asymmetric intensity profile across the petal in the direction of asymmetry.

In various embodiments, the centroid position, Xc, can be approximated by measuring the relative position of the edges of the intensity profile at a given intensity setting, or by integrating the intensity profile with respect to a reference value, i.e. calculating the area between the reference value and the intensity profiles, and determining the centroid of the profiles, i.e. the location of the centroid line so that the calculated areas to the left and right of the line are the same. The OVL tool cannot directly see or measure the actual asymmetric thicknesses of the light-absorbing material on the different walls of the petal(s), so the intensity profile is used, and the original position of the trench for each petal cannot be identified by the overlay tool because there is no contrast between the trench and the rest of the surface. The measured center-of-gravity based on the intensity profile may be different from the center-of-gravity calculated from the petal shape.

In various embodiments, the asymmetric PSR petals can be design rule compatible, where the petals are dimensioned and designed so that their features can be transferred to a resist layer, and the target pattern can be transferred to an underlying layer by an etch process.

To characterize the asymmetry of the deposition, light-absorbing materials are used to provide contrast, where the light-absorbing materials, include, but are not limited to, semiconductor materials, for example, amorphous silicon (a-Si), metals, for example, copper (Cu), cobalt (Co), tungsten (W), ruthenium (Ru), tantalum (Ta), platinum (Pt), metal compounds, for example, tantalum nitride (TaN), tantalum carbide (TaC), titanium nitride (TiN), titanium carbide (TiC), and combinations thereof. The light-absorbing materials are light-absorbing in the spectral range of the OVL metrology tool being used, where the OVL metrology tool may operate in a spectral range (wavelength) of about 200 nanometers (nm) for the near ultraviolet (UV) to about 2500 nm for the near infrared (IR), or about 365 nm to about 1600 nm, or about 400 nm to about 800 nm for the visible spectrum, although other wavelengths and ranges are also contemplated. For example, a-Si may be used as the light-absorbing material for measurements using an OVL metrology tool operating in a wavelength range of about 200 nm to about 425 nm. Metals can be opaque and used throughout the near ultraviolet to near infrared spectral range.

Exemplary applications/uses to which the present invention can be applied include, but are not limited to: for back-end-of-line (BEOL) memory cells.

It is to be understood that aspects of the present invention will be described in terms of a given illustrative architecture; however, other architectures, structures, designs, materials, and process features and steps can be varied within the scope of aspects of the present invention.

Figure 1:
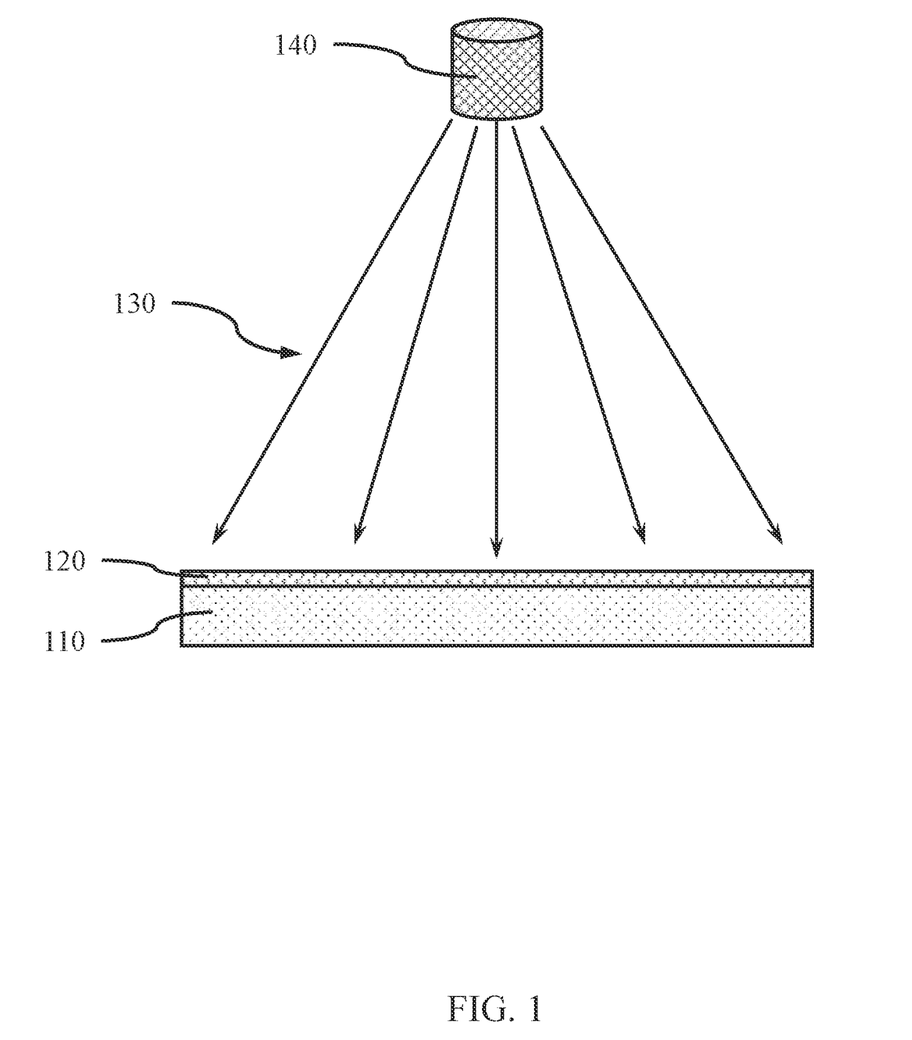
FIG. 1 is a side view showing a deposition source depositing a light-absorbing material layer onto a substrate having an etched layer on the surface, in accordance with an embodiment of the present invention.

Referring now to the drawings in which like numerals represent the same or similar elements and initially to FIG. 1, FIG. 1 is a side view showing a deposition source depositing a light-absorbing material layer onto a substrate having an etched layer on the surface, in accordance with an embodiment of the present invention.

In semiconductor fabrication, materials 130, for example, metals or other light-absorbing materials, can be deposited onto etched features in a surface layer 120 on a substrate 110 from a deposition source 140. For example, trenches for metal lines can be etched into an initial interlayer dielectric (ILD) layer on a device layer, and one or more metals can be deposited into the trenches to form the metal lines. Vias and additional metal lines can be formed in interlayer dielectric (ILD) layers deposited on top of the initial interlayer dielectric (ILD) layer, where the masking and etching of the overlying features must be in register with the metal lines in the initial interlayer dielectric (ILD) layer to make functional electrical connections. Errors can occur in the measurements themselves, and in the subsequent positioning of the layer features. Variations in the placement and size of the features can result in open electrical connections or shorted electrical connections. To properly place each feature in the overlying layers, process control identifies feature placement for each layer. However, due to uneven amounts of metal deposition on alignment targets provided by each lithography mask, the target positioning can appear to shift to the metrology tools that are controlling the alignment of the lithography masks and features.

Asymmetric deposition of a light-absorbing material can result in a perceived shift of the overlay target of the prior layer, which introduces overlay errors that cannot be mitigated without characterizing the location-dependent deposition anisotropy. By recognizing and measuring the uneven (anisotropic) deposition of the light-absorbing material on the targets, these deposition artifacts can be compensated for to avoid misalignments of the lithography masks. Overlay target position for a first layer can be corrected based on these light-absorbing material deposition characteristics. The light-absorbing material deposition asymmetry can be calculated based on the pattern shift response (PSR) shift using asymmetrical PSR petals and targets. To calibrate the measurement once, the measured shift needs to be translated to an amount of asymmetry. For example, a shift in the center-of-gravity of 5 nm using the intensity profile may be correlated with an actual material deposition thickness asymmetry of 1 nm when measured using cross-sectional microscopy (e.g., transmission electron microscopy (TEM), scanning electron microscopy (SEM)). In various embodiments, this may be accomplished by preparing cross-sections of several petals/targets with different shifts, measuring the deposition asymmetry, and calculating a slope that relates the observed shift to actual thicknesses.

Figure 2:
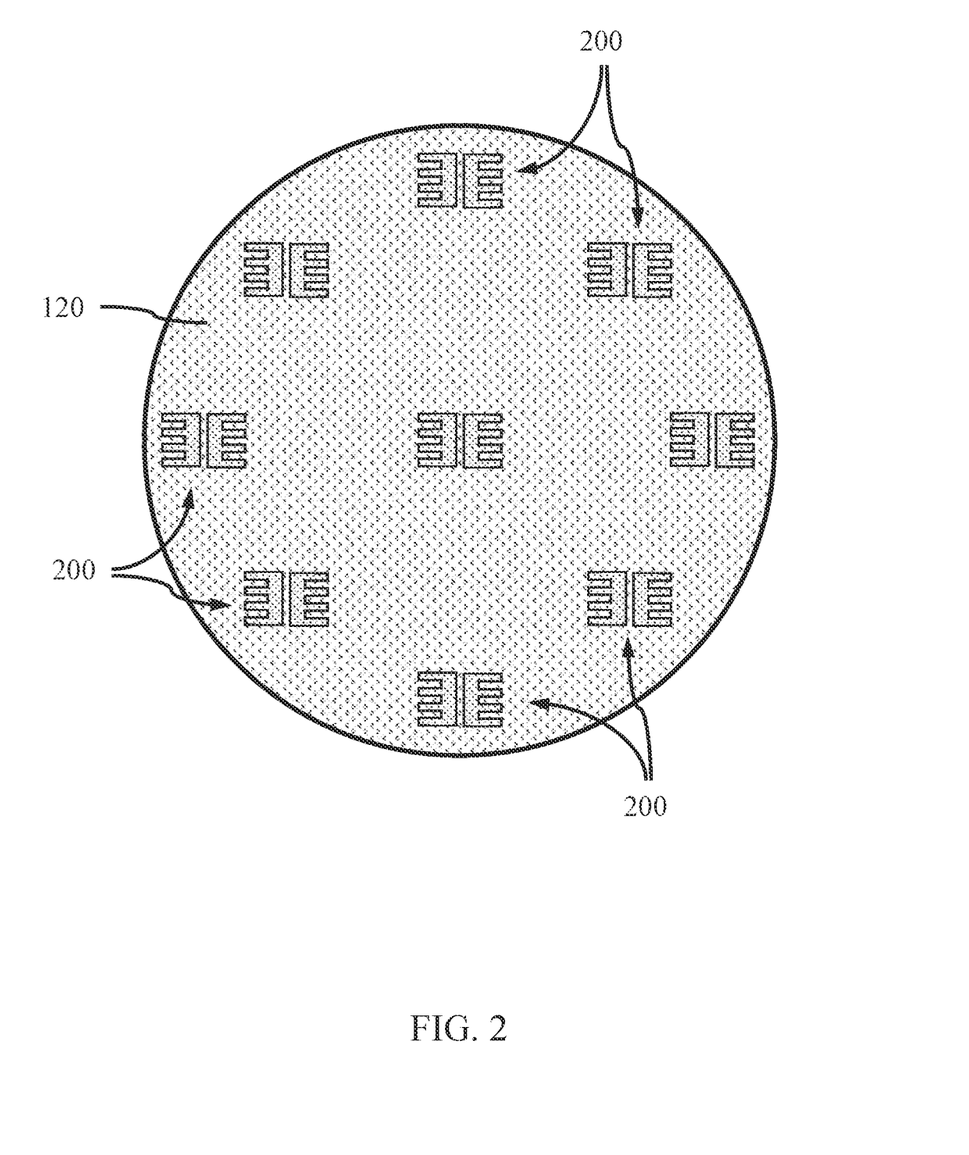
FIG. 2 is a top view showing a plurality of oversized petals etched into layer on the surface of a substrate, in accordance with an embodiment of the present invention.

FIG. 2 is a top view showing a plurality of oversized petals etched into layer on the surface of a substrate, in accordance with an embodiment of the present invention.

In one or more embodiments, a plurality of asymmetrical PSR petals 200 (not to scale) can be etched into a surface layer 120 using lithography and directional etching, for example, reactive ion etching (RIE). The targets 200 can be located at different positions on the substrate based on the location of dies and/or features being formed on the substrate. The locations of the plurality of targets 200 can also provide information on the degree of anisotropy of the material deposition due to the way the material travels in different directions from the deposition source to the surface.

A plurality of asymmetrical PSR petals that are rotated by 90 degrees to each other can also be etched into the surface layer 200, where the combination of initial and rotated asymmetrical PSR petals can provide shift measurements for both an X-axis and a Y-axis.

Figure 3:
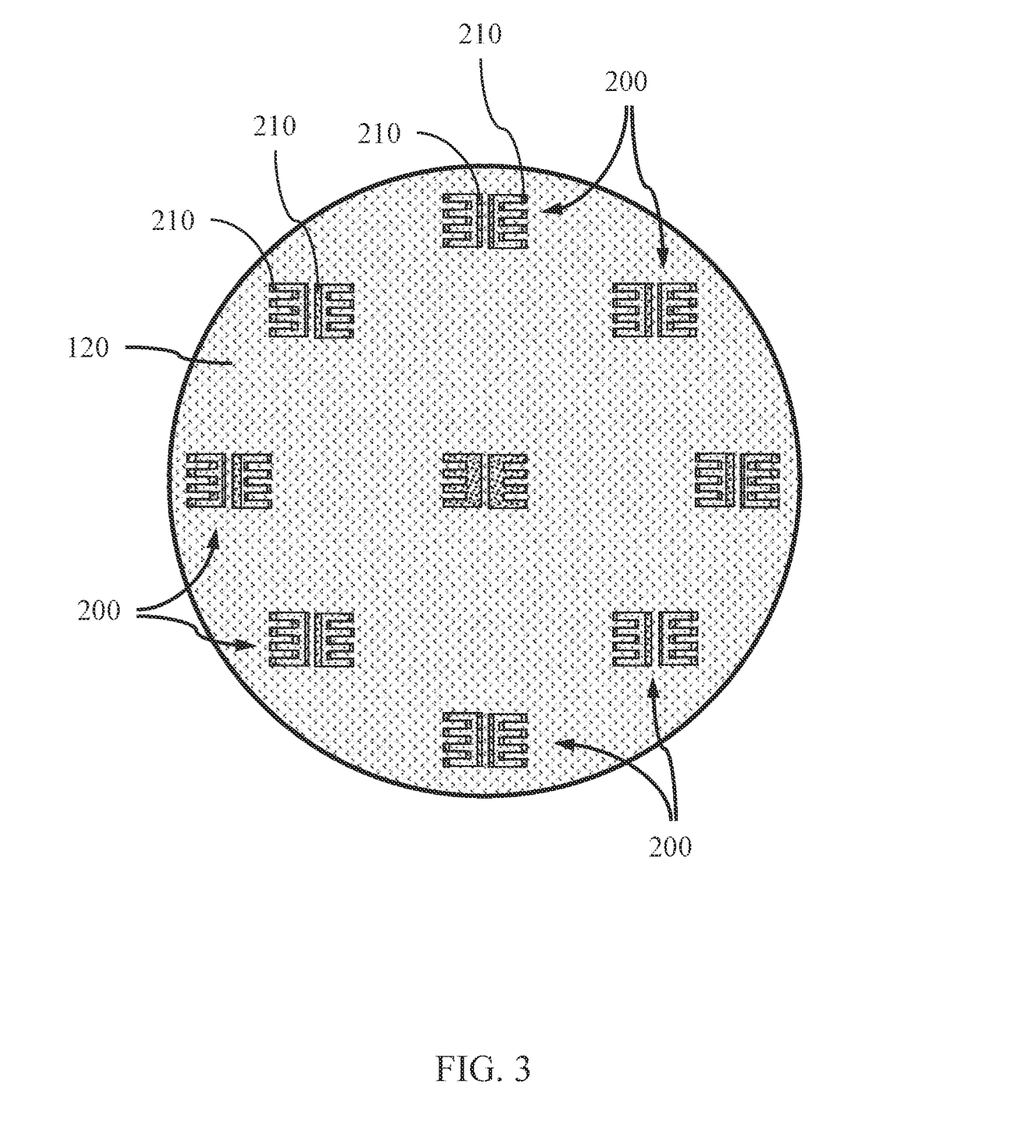
FIG. 3 is a top view showing a light-absorbing material deposited anisotropically onto the plurality of etched petals, in accordance with an embodiment of the present invention.

FIG. 3 is a top view showing a light-absorbing material deposited anisotropically onto the plurality of etched petals, in accordance with an embodiment of the present invention.

In one or more embodiments, the light-absorbing material 210 deposited anisotropically onto the plurality of etched petals 200 in a surface layer 120 can form a coating of different thicknesses on the different walls of the asymmetrical PSR petal shapes. The angular distribution of the light-absorbing material 210 compared to the light-absorbing material 210 deposition on a petal in the center of the substrate directly beneath the deposition source can result in different amounts of the light-absorbing material (e.g., metal, semiconductor, etc.) to be deposited on petal walls facing the source compared to petal walls shadowed from the source. A non-uniform light-absorbing material layer deposition may lead to asymmetric sidewall coating as a function of location (center to edge variation). This coated pattern of petals/targets appears to be shifted when measured across the surface 120 by an optical tool (e.g. OVL microscope). This shift in the center-of-gravity from the deposited absorbing material can cause lithography mask alignment errors for subsequent layers, where the alignment tools attempt to compensate for apparent, but non-existent, shifts in the petals and target(s) themselves. A current layer may be shifted by a distance related to this asymmetric light-absorbing material 210 deposition In various embodiments, 20 targets, each including a plurality of petals, may be used for each chip. In various embodiments, at least three (3) targets may be used (minimum). In various embodiments, a single target may be used per chip being fabricated on a wafer. The targets can be PSR petals in combination with the OVL petals in the surface layer 120.

Figure 4:
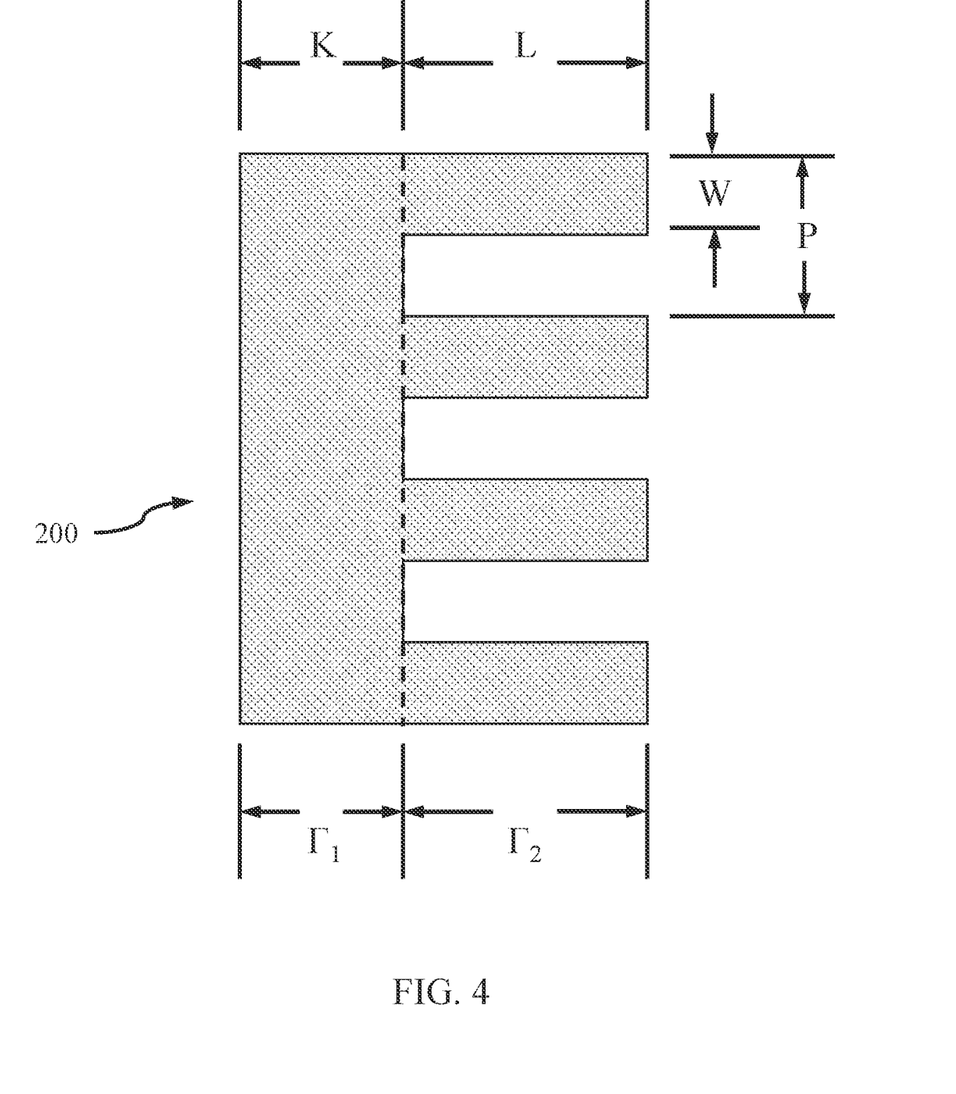
FIG. 4 is a top view showing a non-limiting example of an asymmetric petal, in accordance with an embodiment of the present invention.

FIG. 4 is a top view showing a non-limiting example of an asymmetric petal, in accordance with an embodiment of the present invention.

The center-of-gravity (or centroid) is the midpoint of an integrated density that is sensitive to a target's interior shape and dimensions. For example, a periodic array of lines of fixed width, w, and pitch, p, has an interior density of w/p, referred to as a "duty cycle." A duty cycle is proportional to the dimensions of periodic array elements. In various embodiments, the PSR petal(s) can have dimensions of K in a range of about 100 nm to about 500 nm, or about 200 nm to about 400 nm, and L in a range of about 200 nm to about 600 nm, or about 300 nm to about 500 nm, although other dimensions are also contemplated. In a non-limiting exemplary embodiment, the target can have dimensions of K=360 nm and L=300 nm, p=50 nm, and w=25 nm (50% of duty cycle). In various embodiments, the PSR petal(s) can have a height in a range of about 500 nm to about 3000 nm, although other heights are also contemplated, where the height can be a multiple of the pitch, p, for the number of periodic array elements.

An asymmetric "binary" petal or mark is defined by adjacent regions of differential fixed density ($\Gamma$1, $\Gamma$2). The density is given by the ratio of shape area to the total area within a single pitch. An area that is completely taken up by the target shape would have a $\Gamma$=1. The example shown in FIG. 4 represents densities of $\Gamma$1=1 and $\Gamma$2<1. A total density, $\Gamma$T, of a petal can be calculated as the average of $\Gamma$1+$\Gamma$2. In various embodiments, the target's structure can mimic the minimum design pitch, p, and feature size, w, of the associated integrated circuit device pattern. The center-of-gravity can be shifted based on the lengths, L, and duty cycle w/p of the arms due to the change in density, $\Gamma$2.

In various embodiments, the asymmetric petals can have an E-like or comb-like shape with a solid bar portion and a plurality of arms extending from the solid bar, where the arm region of the E is formed by periodic rectangles or daggers, and has a different density from the solid bar portion. E-shaped targets with four arms have been depicted for illustrative purposes only, and the claims and embodiments are not intended to be limited to depicted shape. Additional non-limiting exemplary shapes have been illustrated in FIG. 5. The arms of the "E" can have a soft resolution, where a gray scale image depends on the size and shape of the arms. The center of gravity after deposition can depend on the length of the arms of the "E". The shift may only be in the horizontal direction.

Figure 5:
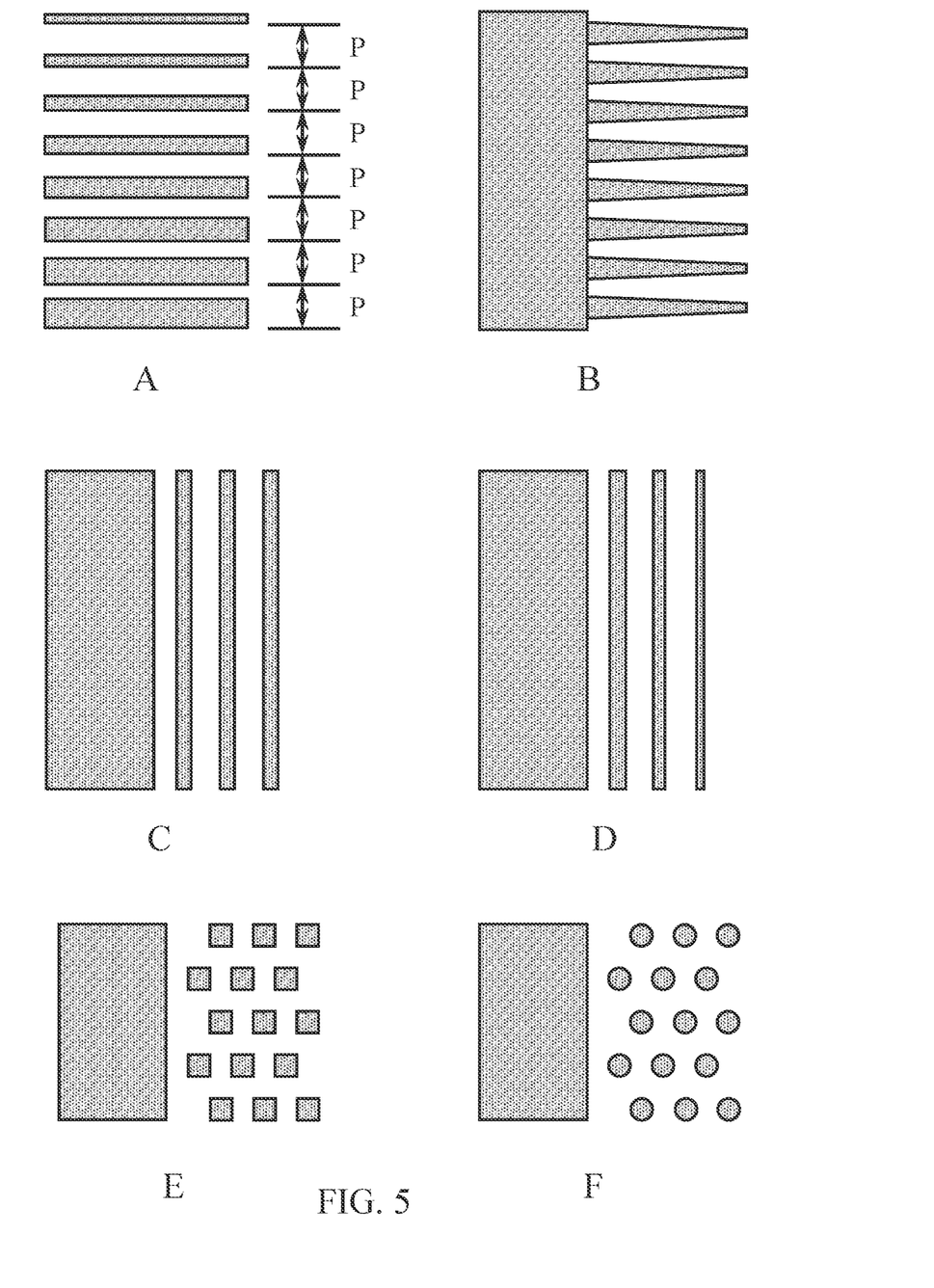
FIG. 5 is a top view showing different asymmetric petal shapes, in accordance with an embodiment of the present invention.

FIG. 5 is a top view showing different asymmetric petal shapes, in accordance with an embodiment of the present invention.

In various embodiments, the asymmetric PSR petals may have shapes other than the "E" (comb) shape, including, but not limited to, (A) a vertical series of parallel line having the same pitch, but a decreasing line width; (B) a solid block (symmetrical portion) with vertical series of tapered (dagger-like) lines having deceasing line widths, but the same pitch; (C) a solid block with lines having equal and uniform line widths parallel to the block; (D) a solid block with parallel lines having decreasing uniform line widths; (E) a solid block and a staggered array of squares/rectangles; or (F) a solid block with a staggered array of circles/ovals/ellipses. The shapes described in A, B, C, D, E, and F can also be combined in various manners, for example, the horizontal lines with a solid block to form a comb-shaped target, horizontal or vertical lines with a uniform thickness, but decreasing or increasing pitch, etc. Each of the petals can include a solid (symmetrical) portion with $\Gamma$=1 and a periodic (asymmetrical) portion with $\Gamma$<1. The symmetrical portion can be a rectangular trench, and each of the asymmetrical portions can be formed by trenches having the described shapes. Various other asymmetric target could be envisaged by a person of ordinary skill in the art from the described shapes, and are intended to be included within the scope of the embodiments of the present invention.

In various embodiments, a plurality of PSR petals can be arranged in a pattern to form a PSR target. The PSR target can be patterned, for example, in the shape of a cross, a pinwheel, an array of rows and columns where alternating PSR petals have the same orientation, or an array of rows and columns where alternating PSR petals can be rotated by 90 degrees. The plurality of PSR petals can be arranged in patterns with each pattern in each of four quadrants to form the target.

Figure 6:
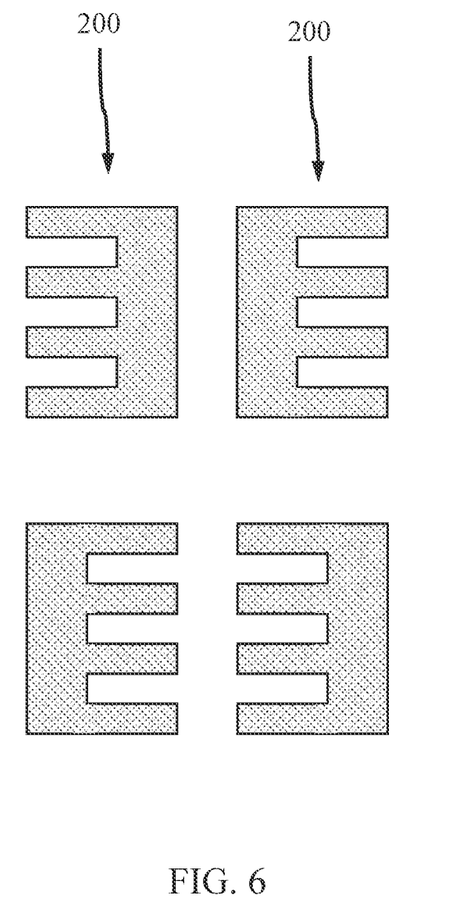
FIG. 6 is a top view showing an asymmetric set of etched PSR petals before the anisotropic deposition of the light-absorbing material, in accordance with an embodiment of the present invention.

FIG. 6 is a top view showing an asymmetric set of etched PSR petals before the anisotropic deposition of the light-absorbing material, in accordance with an embodiment of the present invention.

In one or more embodiments, by placing a pair of asymmetrical petals adjacent to each other, such that they form a mirror image or similar arrangement of features, the extent of the anisotropic material deposition can be determined and compensated for. The set of PSR petals can include a second pair of adjacent asymmetrical petals having the opposite mirror image from the first set. A mirrored configuration of asymmetric PSR petals can form a PSR target that allows determination of the distance, X, between the centroids of the opposing marks as a function of the periodic fine-structure dimension, w.

In various embodiments, a second set of two pairs of PSR petals that are rotated by 90 degrees can be formed with the first set of two pairs of PSR petals to allow determination of the distance, Y, along a Y-axis in addition to determination of the distance, X, along an X-axis.

Figure 7:
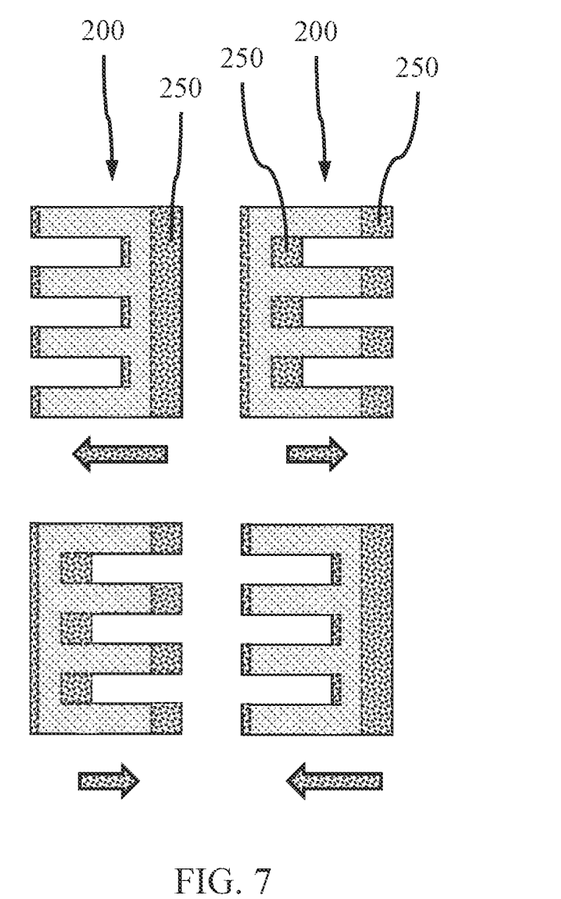
FIG. 7 is a top view showing the asymmetric set of etched PSR petals after the anisotropic deposition of the light-absorbing material, in accordance with an embodiment of the present invention.

FIG. 7 is a top view showing the asymmetric set of etched PSR petals after the anisotropic deposition of the light-absorbing material, in accordance with an embodiment of the present invention.

Larger amounts of light-absorbing material 250, for example, a metal, may be deposited on the walls facing the material deposition source and lesser amounts deposited on the walls facing away from the material deposition source for each of the PSR petals. However, because the pair of PSR petals 200 are asymmetrical and mirror images, each of the petals 200 appear to shift in a different direction, and the center of gravity of each target may appear to shift by a different amount. The combined center of gravity difference between the two petal pairs can be equal to twice the metal deposition asymmetry. The pattern shift response (PSR) can be calculated as the relative change in the centroid positions of the opposing petals.

Upon light-absorbing material deposition, the upper right and lower left quadrant PSR petals are "shifting" to the right due to the greater amount of light-absorbing material deposition, while the upper right and lower left quadrant PSR petals are "shifting" to the left due to the asymmetric shape. The combined center of gravity difference between the two PSR petal groups will be equal to twice the light-absorbing material deposition asymmetry. The deposition asymmetry characterization can be done across a wafer with multiple PSR targets.

Upon light-absorbing material (e.g., metal) deposition, the upper right and lower left quadrant patterns are "shifting" to the right while the other two patterns are "shifting" to the left. The combined center of gravity difference between the two petal groups will be equal to twice the metal deposition asymmetry. Metal deposition asymmetry can be characterization across a wafer with multiple PSR targets.

In various embodiments, the asymmetric side (e.g., 'arms') of the target may be pointing only either left/right or up/down, which measures an X or Y component, respectively. The measurement uncertainty is so low that an averaging, rather than vector addition, is not necessary but may be employed. The arms of the "E" (or in general, the asymmetry) needs to be sub-resolution for the metrology tool, which can be a microscope. This can then result in a greyscale image that depends on the specific design dimensions. Depending on the specific process conditions, it may be that the shift is only in the horizontal (x-direction) but more common is a shift in both directions.

Figure 8:
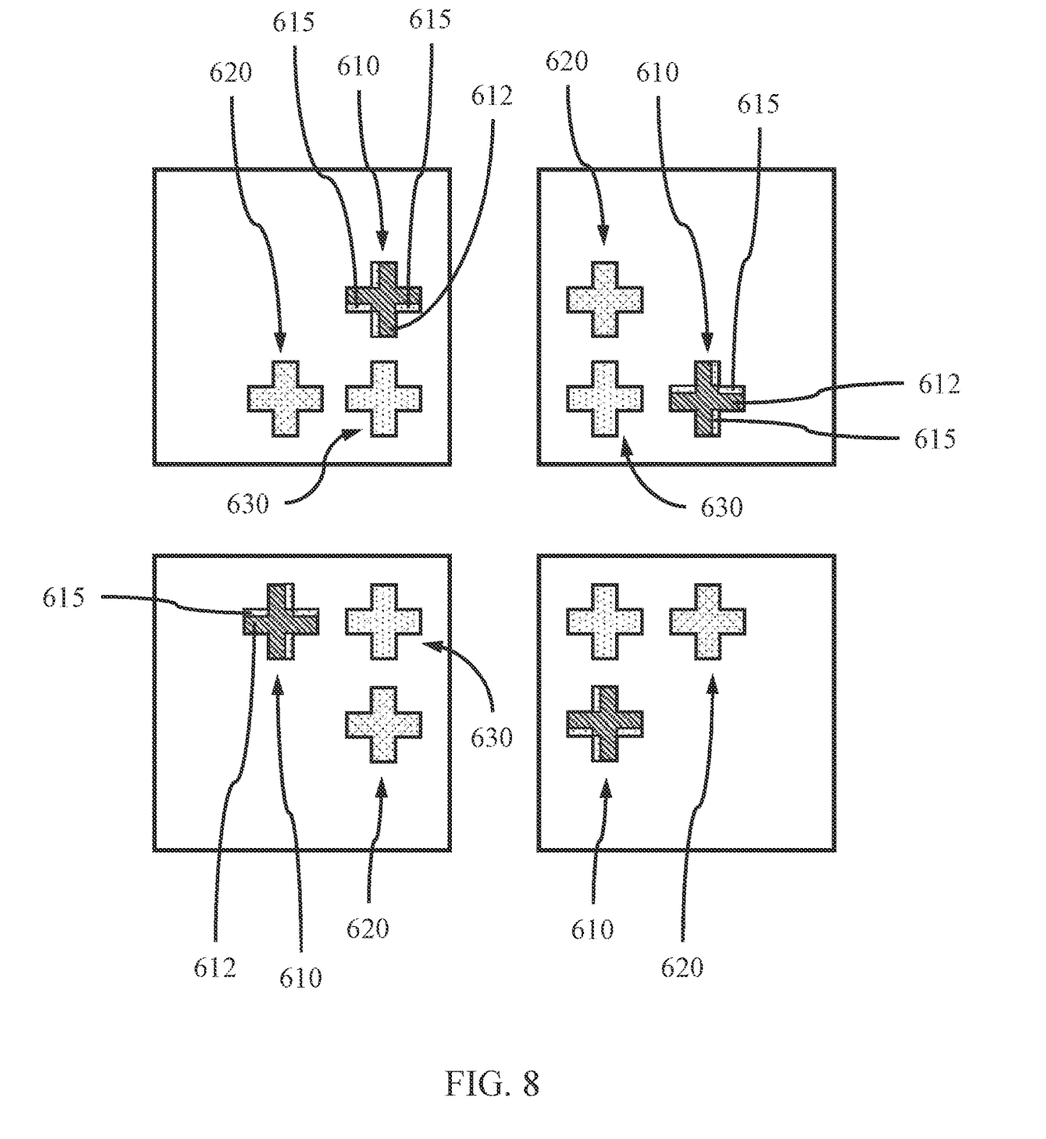
FIG. 8 is a top view showing a target with a PSR petal and overlay petals positioned in each of four quadrants, in accordance with an embodiment of the present invention.

FIG. 8 is a top view showing a target with a PSR petal and overlay petals positioned in each of four quadrants, in accordance with an embodiment of the present invention.

In various embodiments, the plurality of petals can form sets of different petals, where a different, for example, rotated, arrangement of the petals can be located in each of four quadrants. Each set of petals can include a PSR petal 610, which can have a cross-shape with solid portions 612 and periodic portions 615, a current overlay petal 620, which can have a cross-shape, and a prior overlay petal 630, that can have a cross-shape. The PSR petal 610 with its asymmetric edge can be rotated between quadrants of the target. The cross-shaped PSR petal can be formed by four adjacent PSR petals joined at the center region. In various embodiments, the PSR petal can be pinwheel shaped, with four offset PSR petals not joined at a center region. The footprint of the combined set of targets can have a footprint of about 16 microns by 16 microns. A petal can occupy the area of about 4×4 um², so petals in three of the four positions would make the total area about 16×16 um². Other petal arrangements/patterns can also be utilized, for example, 4×4 petals, 4×9 petals, or 4×12 petals.

In various embodiments, an arrangement of four sets of petals 610, 620, 630 can be used, where a single PSR petal 610, a single current overlay petal 620, and a single prior overlay petal 630 can be located as an array in each quadrant of a surface to form the complete target. Four quadrants can be used to provide two quadrants with each orientation, that can provide sufficient information to compensate for the PSR. An empty region (white space) may be between each of the quadrants. In various embodiments, each quadrant can have from 1 to 16 different petal designs, i.e. pitches and/or critical dimensions (CDs), for the target. In various embodiments, a center mark may be included in the center of the set of PSR petals, when the target includes a plurality of sets, to identify the particular petals forming each of the sets for measurement. A pattern recognition feature may also be included to identify the specific type of target to the metrology tool.

In various embodiments, the position and orientation of the asymmetric PSR petals can be rotated between each quadrant of the target, where the PSR petal(s) in the quadrants across a diagonal have the same orientation, and PSR petal(s) in adjacent quadrants have a mirrored orientation.

In various embodiments, an asymmetric PSR target can be included with an existing OVL target/petal/mark, for example, a BLO target, triple AIM target, DBO target, etc.

Figure 9:
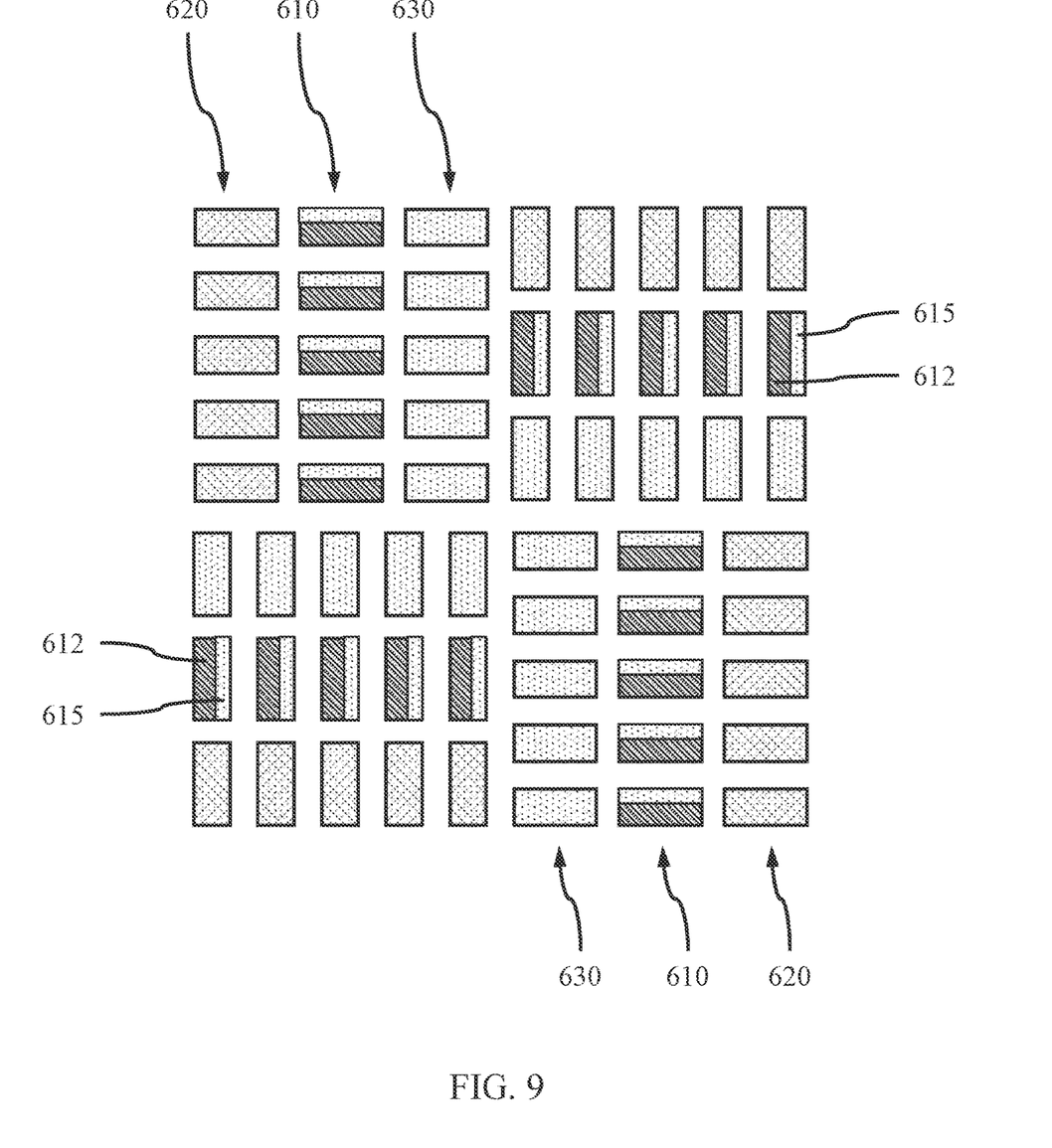
FIG. 9 is a top view showing a Triple AIM target with a set of PSR petals and overlay petals located in each of four quadrants, in accordance with an embodiment of the present invention.

FIG. 9 is a top view showing a Triple AIM target with a set of PSR petals and overlay petals located in each of four quadrants, in accordance with an embodiment of the present invention.

In various embodiments, the plurality of petals can form a target, where a different, for example, rotated, arrangement of the petals can be located in each of four quadrants. Each set of targets can include a PSR target 610, which can have an asymmetrical shape with a solid (symmetrical) portion 612 and periodic (asymmetrical) portion 615, a plurality of current overlay targets 620, which can have a symmetrical shape, and a plurality of prior overlay targets 630, that can have a symmetrical shape. This can form a "triple AIM" target (Advanced Imaging Metrology (AIM) mark), where the prior target 630 and the PSR target 610 are all in a lower layer/level of deposition, and the current overlay targets 620 are all in a second or current layer (e.g., top resist and/or dielectric layer). The rectangular shape depicted in FIG. 9 is for illustrative/representational purposes only, where the actual targets are asymmetrical shapes. The footprint of the combined set of targets can have a footprint of about 16 microns by 16 microns.

Figure 10:
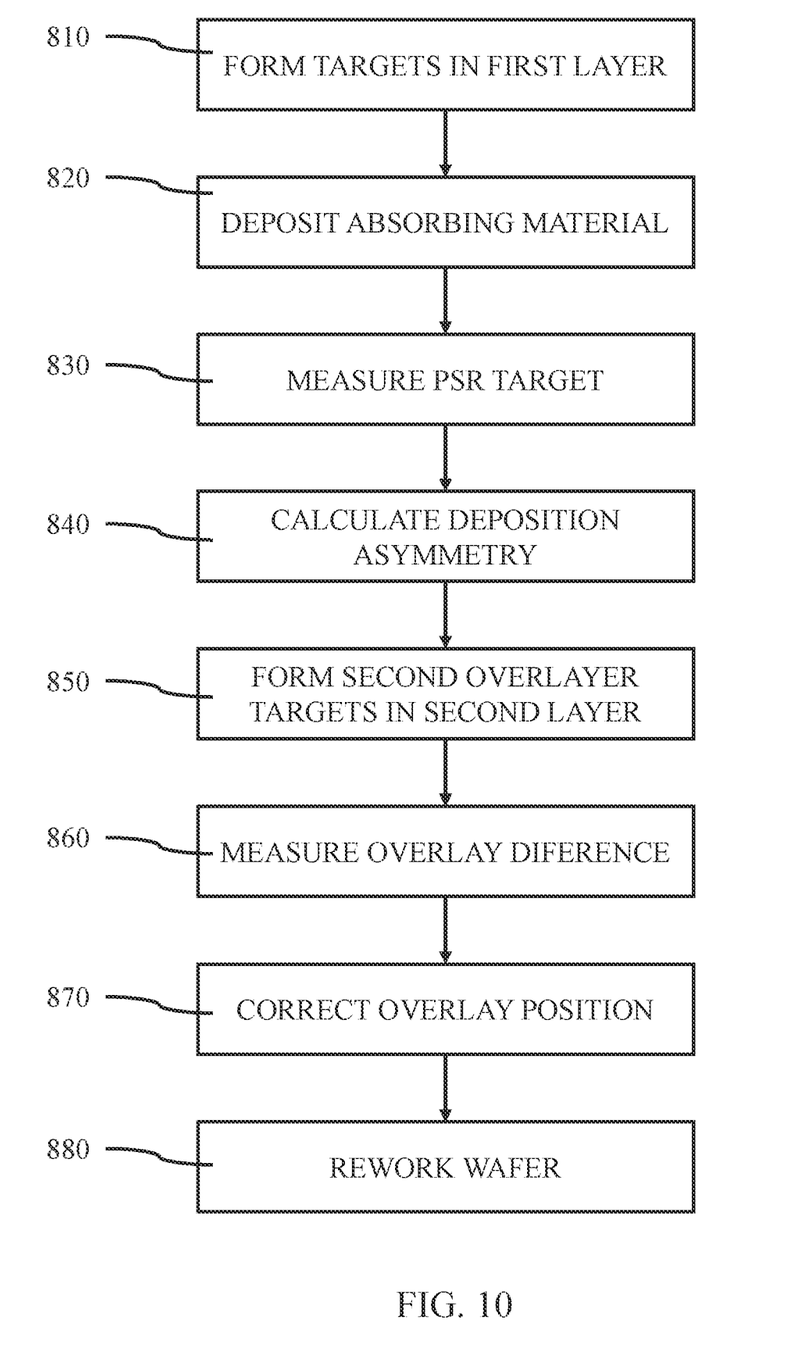
FIG. 10 is a block/flow diagram showing a system/method of correcting overlay misalignment adjustments, in accordance with an embodiment of the present invention.

FIG. 10 is a block/flow diagram showing a system/method of correcting overlay misalignment adjustments, in accordance with an embodiment of the present invention.

At block 810, one or more overlay target(s) (prior overlay feature) and one or more PSR target(s) can be formed in a first layer.

At block 820, a light-absorbing material, for example, a semiconductor, metal, or metal compound, can be deposited on the overlay petals and PSR petals forming the targets. In various embodiments, the absorbing material can be, for example, semiconductor materials, for example, amorphous silicon (a-Si), a metal, including, but not limited to, copper (Cu), tungsten (W), cobalt (Co), molybdenum (Mo), tantalum (Ta), ruthenium (Ru), platinum (Pt), a metal compound, including, but not limited to, tantalum nitride (TaN), tantalum carbide (TaC), titanium nitride (TiN), titanium carbide (TiC), and combinations thereof.

At block 830, the asymmetry of the of the absorbent material deposited on the PSR target(s) can be measured using an image based overlay tool or a microscope with image analysis software that can determine an intensity profile for the PSR petals. A pattern shift response (PSR) can be determined from the light-absorbing material on each of the walls of the at least four asymmetrical petals. For example, with x-direction asymmetry, the centroid, $X_c$, of an arbitrary density distribution $\Gamma(x)$ can be determined. The asymmetry in the y-direction can also be measured for suitable PSR petals arranged in the targets.

At block 840, the metal deposition asymmetry can be calculated based on the PSR shifts of each of the individual PSR targets. The PSR shifts show a relative deposition inhomogeneity rather than an actual change in deposition thickness. This can depend on design and critical dimensions, and can involve a one-time calibration; or can be done based on shift-slope if multiple PSR targets are used. The metal deposition asymmetry can be calculated from on the PSR shifts using a conversion factor from the 1-time calibration using a destructive cross-sectional microscopy technique. For example, 10 nm determined for the PSR shift can be correlated with a 1 nm change in actual deposition thickness.

At block 850, a second overlay target can be formed in a resist (a current overlay feature).

At block 860, the different in the overlay positions between a current overlay petal 620 and a prior overlay petal 630 can be measured. PSR measurements can be made after each pattern step. In various embodiments, PSR measurements can be made before 820 (pre metal deposition) and then at 830 (post metal deposition) to account for any biases introduced during the formation of the target/petal/mark (mainly lithography and etching).

At block 870, the overlay target position of first layer can be calculated based on metal deposition characteristics to obtain true overlay shift across the wafer. Overlay measurement can involve the determination of the center-of-gravity of each overlay petal/target/mark structures along both the X and Y axis. The measured overlay error between prior and current OVL petals can be corrected by the measured metal deposition asymmetry determined from the PSR targets. For example, if the at a certain location on the wafer the metal deposition was determined to be +2 nm in X (horizontal; e.g. left edge gets 2 nm more deposition than right edge) and +3 nm in Y (vertical; e.g. bottom edge gets 3 nm more deposition than top edge) based on the PSR measurements obtained after the metal deposition, then these are the numbers divided by two that need to be added to the overlay vector because that is the resulting center of gravity shift of the prior OVL petal. PSR targets can be used to characterize the metal deposition asymmetry, and location-specific values from the PSR shifts can be used to correct for OVL measurements errors. The overlay shift is calculated by the difference in the center of gravity of prior and current petals. The center of gravity is determined based on four features arranged, for example, in the four quadrants. In order to do so, the center of gravity of the individual petals would be determined first.

At block 880, the wafer can be reworked if required, and feedback of the adjustment provided to the lithography scanner to adjust exposure corrections for subsequent lots. If a problem is detected by an overlay metrology tool after a lithography step, the wafer can be re-worked. A wafer with misaligned layers can be reworked by etching away the layers that are not in the proper intended position, and new layers and/or depositions formed on the wafer. If a problem is not detected, and the wafer moves to a subsequent step, the wafer may be scrapped.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above." "upper." and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of characterizing asymmetric depositions on a target, comprising:
    forming at least four asymmetrical petals in a layer on a substrate;
    depositing a light-absorbing material on the at least four asymmetrical petals, wherein the light-absorbing material deposits unevenly on a plurality of walls of the at least four asymmetrical petals;
    determining a pattern shift response (PSR) from the light-absorbing material on each of the walls of the at least four asymmetrical petals;
    converting the pattern shift response (PSR) to an asymmetry of thicknesses of the light-absorbing material deposited on facing walls of the at least four asymmetrical petals; and
    correcting an overlay petal position based on the asymmetry of thicknesses.

2. The method of claim 1, wherein the at least four asymmetrical petals include two pairs of two comb-shaped petals, wherein each comb-shaped petal has a symmetrical portion and a plurality of arms extending from the symmetrical portion.

3. The method of claim 1, wherein the at least four asymmetrical petals include two pairs of a vertical series of parallel line having the same pitch, but a decreasing line width, with one pair rotated 90 degrees from the other pair.

4. The method of claim 1, wherein the at least four asymmetrical petals include two pairs of a vertical series of tapered (dagger-like) lines having deceasing line widths, but the same pitch, with one pair rotated 90 degrees from the other pair.

5. The method of claim 1, wherein the at least four asymmetrical petals include two pairs of a solid block with parallel lines having decreasing line widths with one pair rotated 90 degrees from the other pair.

6. The method of claim 1, wherein the at least four asymmetrical petals include two pairs of a solid block and a staggered array of squares/rectangles with one pair rotated 90 degrees from the other pair.

7. The method of claim 1, wherein the at least four asymmetrical petals include two pairs of two asymmetrical petals, wherein the two asymmetrical petals of each pair form a mirror image.

8. The method of claim 7, wherein there are four asymmetrical petals per die on a wafer.

9. The method of claim 8, further comprising an overlay petal adjacent to the at least four asymmetrical petals.

10. The method of claim 9, wherein the at least four asymmetrical petals include a first set of four adjacent asymmetrical petals adjacent to a second set of four adjacent asymmetrical petals.

11. A method of characterizing asymmetric depositions on a target, comprising:
    forming at least four asymmetrical petals in a layer on a substrate, wherein the at least four asymmetrical petals include two pairs of two asymmetrical petals, wherein the two asymmetrical petals of each pair form a mirror image, and wherein a third pair of asymmetrical petals has a different duty cycle than the first two pairs;
    depositing a light-absorbing material on the at least four asymmetrical petals, wherein the light-absorbing material deposits unevenly on a plurality of walls of the at least four asymmetrical petals;
    determining a pattern shift response (PSR) from the light-absorbing material on each of the walls of the at least four asymmetrical petals;
    converting the pattern shift response (PSR) to an asymmetry of thicknesses of the light-absorbing material deposited on facing walls of the at least four asymmetrical petals; and
    correcting an overlay petal position based on the asymmetry of thicknesses.

12. The method of claim 11, wherein the at least four asymmetrical petals include a first set of four adjacent asymmetrical petals adjacent to a second set of four adjacent asymmetrical petals.

13. The method of claim 11, wherein the at least four asymmetrical petals include two pairs of a solid block with parallel lines having decreasing line widths with one pair rotated 90 degrees from the other pair.

14. The method of claim 11, wherein each of the at least four asymmetrical petals forms a triple aim target.

* * * * *